(12) United States Patent
Rana et al.

(10) Patent No.: US 11,749,717 B2
(45) Date of Patent: Sep. 5, 2023

(54) TRANSISTOR WITH EMBEDDED ISOLATION LAYER IN BULK SUBSTRATE

(71) Applicant: GLOBALFOUNDRIES U.S. INC., Malta, NY (US)

(72) Inventors: Uzma Rana, Slingerlands, NY (US); Anthony K. Stamper, Burlington, VT (US); Johnatan A. Kantarovsky, South Burlington, VT (US); Steven M. Shank, Jericho, VT (US); Siva P. Adusumilli, Burlington, VT (US)

(73) Assignee: GLOBALFOUNDRIES U.S. INC., Malta, NY (US)

( * ) Notice: Subject to any disclaimer, the term of this patent is extended or adjusted under 35 U.S.C. 154(b) by 0 days.

(21) Appl. No.: 17/738,179

(22) Filed: May 6, 2022

(65) Prior Publication Data
US 2022/0262900 A1   Aug. 18, 2022

Related U.S. Application Data

(63) Continuation of application No. 16/939,213, filed on Jul. 27, 2020, now Pat. No. 11,380,759.

(51) Int. Cl.
| | |
|---|---|
| *H01L 29/06* | (2006.01) |
| *H01L 21/762* | (2006.01) |
| *H01L 29/78* | (2006.01) |
| *H01L 29/66* | (2006.01) |
| *H01L 21/8234* | (2006.01) |

(Continued)

(52) U.S. Cl.
CPC ........ *H01L 29/0653* (2013.01); *H01L 21/763* (2013.01); *H01L 21/76264* (2013.01);
(Continued)

(58) Field of Classification Search
CPC .......... H01L 29/66681; H01L 29/7816; H01L 29/7824; H01L 29/1095; H01L 29/0653;
(Continued)

(56) References Cited

U.S. PATENT DOCUMENTS

| | | |
|---|---|---|
| 9,601,595 B2 | 3/2017 | Yang et al. |
| 9,673,084 B2 | 6/2017 | Liu |

(Continued)

OTHER PUBLICATIONS

Specification and Figures for U.S. Appl. No. 16/800,011, filed Feb. 25, 2020, 39 pages.

(Continued)

*Primary Examiner* — Jose R Diaz
(74) *Attorney, Agent, or Firm* — Francois Pagette; Andrew M. Calderon; Calderon Safran & Cole, P.C.

(57) ABSTRACT

The present disclosure relates to semiconductor structures and, more particularly, to a transistor with an embedded isolation layer in a bulk substrate and methods of manufacture. The structure includes: a bulk substrate; an isolation layer embedded within the bulk substrate and below a top surface of the bulk substrate; a deep trench isolation structure extending through the bulk substrate and contacting the embedded isolation layer; and a gate structure over the top surface of the bulk substrate and vertically spaced away from the embedded isolation layer, the deep trench isolation structure and the embedded isolation layer defining an active area of the gate structure in the bulk substrate.

20 Claims, 2 Drawing Sheets

(51) Int. Cl.
    *H01L 21/763*     (2006.01)
    *H01L 29/10*     (2006.01)

(52) U.S. Cl.
    CPC .................. *H01L 21/76283* (2013.01); *H01L 21/823481* (2013.01); *H01L 29/1095* (2013.01); *H01L 29/66681* (2013.01); *H01L 29/7816* (2013.01); *H01L 29/7841* (2013.01)

(58) Field of Classification Search
    CPC ........... H01L 29/7841; H01L 21/76264; H01L 21/76283; H01L 21/823481
    See application file for complete search history.

(56) References Cited

U.S. PATENT DOCUMENTS

| | | | |
|---|---|---|---|
| 10,164,006 B1 * | 12/2018 | Ciavatti | ............ H01L 21/02107 |
| 10,192,779 B1 | 1/2019 | Shank et al. | |
| 11,380,759 B2 * | 7/2022 | Rana | ................... H01L 29/0653 |
| 2011/0101425 A1 | 5/2011 | Grote | |
| 2011/0241092 A1 | 10/2011 | Khemka | |
| 2012/0044732 A1 | 2/2012 | Li | |
| 2014/0291767 A1 | 10/2014 | Lee | |
| 2017/0194490 A1 * | 7/2017 | Li | ..................... H01L 29/42384 |
| 2019/0103471 A1 | 4/2019 | Aghoram et al. | |
| 2019/0259829 A1 | 8/2019 | Mun | |
| 2020/0027951 A1 | 1/2020 | Hebert | |

OTHER PUBLICATIONS

Sunitha HD et al.,"n-Channel LDMOS With STI for Breakdown Voltage Enhancement and Improved RON", Journal of Theoretical and Applied Information Technology Jan. 31, 2017. vol. 95. No. 2. 8 pages.

* cited by examiner

TRANSISTOR WITH EMBEDDED ISOLATION LAYER IN BULK SUBSTRATE

FIELD OF THE INVENTION

The present disclosure relates to semiconductor structures and, more particularly, to a transistor with an embedded isolation layer in a bulk substrate and methods of manufacture.

BACKGROUND

A laterally-diffused metal-oxide semiconductor (LDMOS) is a planar double-diffused metal-oxide-semiconductor field-effect transistor that exhibit high output power. The LDMOS can be used in many different application, mainly in RF and microwave applications. For example, silicon-based RF LDMOS devices are used as RF power amplifiers in mobile networks.

LDMOS, though, can exhibit poor substrate isolation, which reduces substrate assisted depletion. This, in turn, leads to the reduction of breakdown voltages. To solve this issue, LDMOS can be fabricated using silicon on insulator (SOI) technologies. In SOI, isolation underneath an active area of semiconductor, device as LDMOS, is achieved with the insulator layer (e.g., buried oxide) under the active silicon layer. The shortcoming of this approach is that SOI wafers are very expensive compared to bulk wafer implementations.

SUMMARY

In an aspect of the disclosure, a structure comprises: a bulk substrate; an isolation layer embedded within the bulk substrate and below a top surface of the bulk substrate; a deep trench isolation structure extending through the bulk substrate and contacting the embedded isolation layer; and a gate structure over the top surface of the bulk substrate and vertically spaced away from the embedded isolation layer, the deep trench isolation structure and the embedded isolation layer defining an active area of the gate structure in the bulk substrate.

In an aspect of the disclosure, a structure comprises: a bulk semiconductor substrate; an isolation layer buried within the bulk semiconductor substrate; a gate structure over the bulk semiconductor substrate and vertically spaced away from the buried isolation layer; and dual depth isolation structures extending through the bulk semiconductor substrate, the dual depth isolation structures comprising: a first dual depth isolation structure contacting the buried isolation layer and with the buried isolation layer defining an active region under the gate structure within the bulk semiconductor substrate; and a second dual depth isolation structure separated from the buried isolation layer and adjacent to the gate structure.

In an aspect of the disclosure, a method comprising: damaging a bulk semiconductor substrate to form an embedded amorphous isolation layer within the bulk semiconductor substrate, below a top surface of the bulk substrate; forming a deep trench isolation structure extending through the bulk semiconductor substrate and contacting the embedded amorphous isolation layer; forming a shallow trench isolation structure extending through the bulk semiconductor substrate and separated from the embedded amorphous isolation layer with single crystalline material of the bulk semiconductor substrate; and forming a gate structure over the top surface of the bulk semiconductor substrate and vertically spaced away from the embedded amorphous isolation layer, the deep trench isolation structure and the embedded amorphous isolation layer defining an active area of the gate structure in the bulk semiconductor substrate.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a transistor with an embedded isolation layer in a bulk substrate and methods of manufacture. More specifically, the present disclosure is directed to a metal-oxide semiconductor (MOS) device comprising an isolation material under an active area of the device to provide isolation from the bulk substrate. In embodiments, the isolation material is a polysilicon layer embedded within the bulk substrate, itself. Advantageously, the polysilicon layer will improve device performance in bulk wafer applications as discussed in more detail herein.

In more specific embodiments, the device includes a high resistivity Si substrate with an embedded isolation layer. The embedded isolation layer is a high resistivity amorphous material, e.g., polysilicon material, buried within the substrate. The device also includes a deep trench isolation structure in combination with a shallow trench isolation structure or, alternatively, phosphoryl nitride (OP nitride) or a thermal oxide drift region. In any scenario, a dual depth isolation region combined with the isolation region under an active area of the device forms an improved laterally-diffused metal-oxide semiconductor (LDMOS) or a lateral extended drain MOSFET (EDMOS), as examples.

The transistors of the present disclosure can be manufactured in a number of ways using a number of different tools. In general, though, the methodologies and tools are used to form structures with dimensions in the micrometer and nanometer scale. The methodologies, i.e., technologies, employed to manufacture the transistors of the present disclosure have been adopted from integrated circuit (IC) technology. For example, the structures are built on wafers and are realized in films of material patterned by photolithographic processes on the top of a wafer. In particular, the fabrication of the transistors uses three basic building blocks: (i) deposition of thin films of material on a substrate, (ii) applying a patterned mask on top of the films by photolithographic imaging, and (iii) etching the films selectively to the mask.

Figure 1:
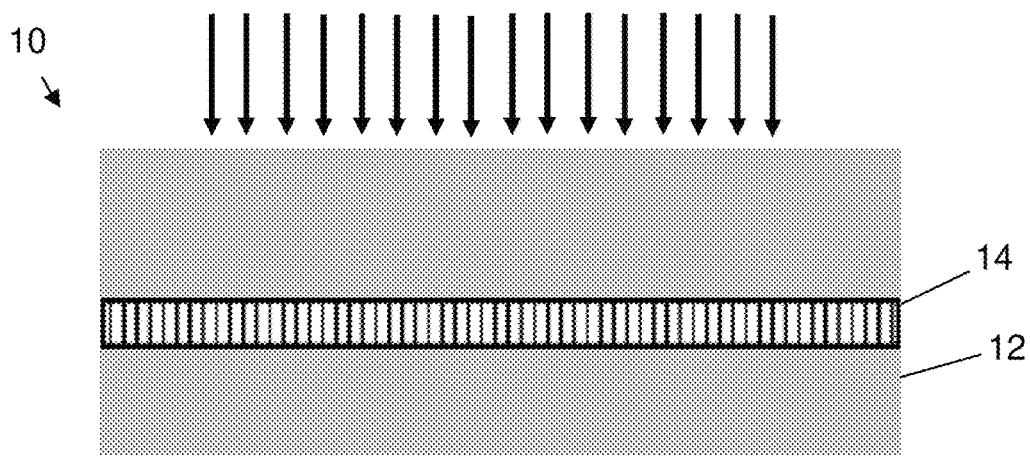
FIG. 1 shows a substrate with an embedded isolation layer and respective fabrication processes in accordance with aspects of the present disclosure.

FIG. 1 shows a substrate with an embedded isolation layer and respective fabrication processes in accordance with aspects of the present disclosure. More specifically, the structure 10 of FIG. 1 includes a high resistivity substrate 12 and an isolation layer 14 embedded (e.g., buried below a top surface) within the high resistivity substrate 12. In embodiments, the substrate 12 is a bulk substrate composed of single crystalline Si; although other bulk substrates are contemplated herein. For example, the substrate 12 may be composed of any suitable bulk material including, but not limited to, Si, SiGe, SiGeC, SiC, GaAs, InAs, InP, and other III/V or II/VI compound semiconductors. The resistivity of the substrate 12 can be, e.g., upwards of $10^5$ Ωcm for Si material; although other resistivities and materials are contemplated herein. By way of another example, the substrate 12 can be a high resistivity Si substrate for GHz and THz applications manufactured by HiRes™.

In embodiments, the isolation layer 14 embedded within the substrate 12 is a high resistivity polysilicon material. The polysilicon material 14 can be formed by an implantation process followed by a rapid anneal process. For example, the substrate 12 can be subjected to an argon implant at 400 KeV and a dose of 1.25E15. This concentration and dosage will effectively damage the substrate 12, forming an amorphous silicon layer, e.g., polysilicon. Following the implantation process, a rapid anneal process is performed to recrystallize the upper portion of the substrate 12 (e.g., single crystalline material) leaving polysilicon material 14, e.g., damaged or amorphous material, embedded within the single crystalline substrate 12.

It should further be understood that the present disclosure is not limited to an argon implantation process. For example, the implantation process can use any non-dopant or any noble gas. Moreover, the implantation process can be any implantation process with the same valance as Si, $N_2$, or Ge, as further examples. Moreover, the thickness of the isolation layer 14 can be in the range of 50 nm to 1000 nm. In further embodiments, the thickness of the isolation layer 14 can be 400 nm to 500 nm and, in still further embodiments, the thickness of the isolation layer 14 can be about 100 nm to 200 nm.

In addition, the thickness of the isolation layer 14 can vary throughout the substrate 12 or be provided in specific portions of the substrate 12, depending on the focus of the implantation process. For example, the thickness of the isolation layer 14 can be greater under deep trench isolation regions, compared to an active area of the device or under a shallow trench isolation region as further described herein. Also, the isolation layer 14 can be provided in only in specific regions of the substrate 12 such as only under an active area of a device between the deep trench isolation structure(s), hence not across the entire substrate 12.

Figure 2:
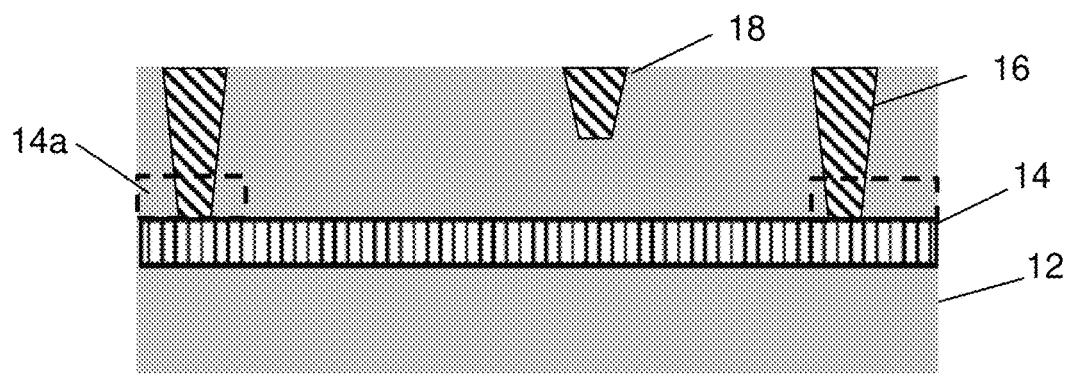
FIG. 2 shows dual depth isolation regions in the substrate and respective fabrication processes in accordance with aspects of the present disclosure.

In FIG. 2, a deep trench isolation structure(s) 16 and a shallow trench isolation structure(s) 18 are formed in the substrate 12. In more specific embodiments, the deep trench isolation structure(s) 16 and the shallow trench isolation structure(s) 18 are formed over the isolation layer 14, with the deep trench isolation structure(s) 16 extending to and in contact with the isolation layer 14 embedded within the substrate 12. As already described, the isolation layer 14 can be thicker under the deep trench isolation structure(s) 16 compared to a thinner portion under the shallow trench isolation structure(s) 18, as shown by the dashed lines at reference numeral 14a. Also, the shallow trench isolation structure(s) 18 is preferably formed within a space between the deep trench isolation structure(s) 16 adjacent to a gate structure, which forms a drift region for the device.

The deep trench isolation structure(s) 16 and the shallow trench isolation structure(s) 18 are formed using separate lithography, etching and deposition processes due to the different depths of the isolation structure(s) 16, 18. For example, in fabricating the deep trench isolation structure(s) 16 and shallow trench isolation structure(s) 18, separately, a resist formed over the substrate 12 is exposed to energy (light) to form a pattern (opening). An etching process with a selective chemistry, e.g., reactive ion etching (RIE), will be used to form one or more trenches in the substrate 12 through the openings of the resist. For the deep trench isolation structure(s) 16, the trench will reach to the isolation layer 14 embedded within the substrate 12; whereas, for the shallow trench isolation structure(s) 18, the trench will be shallower such that a single crystalline semiconductor layer, e.g., substrate 12, is provided between the shallow trench isolation structure(s) 18 and the isolation layer 14. Following resist removal by a conventional oxygen ashing process or other known stripants, insulator material ($SiO_2$) can be deposited by any conventional deposition processes, e.g., chemical vapor deposition (CVD) processes. Any residual material on the surface of the substrate 12 can be removed by conventional chemical mechanical polishing (CMP) processes.

In alternative embodiments, the shallow trench isolation structure(s) 18 can be replaced with nitride (OP nitride) or a thermal oxidation. Moreover, in further alternative embodiments, the deep trench isolation structure(s) 16 can be formed prior to the implant and rapid thermal anneal processes, followed by the formation of the shallow trench isolation structure(s) 18.

Figure 3:
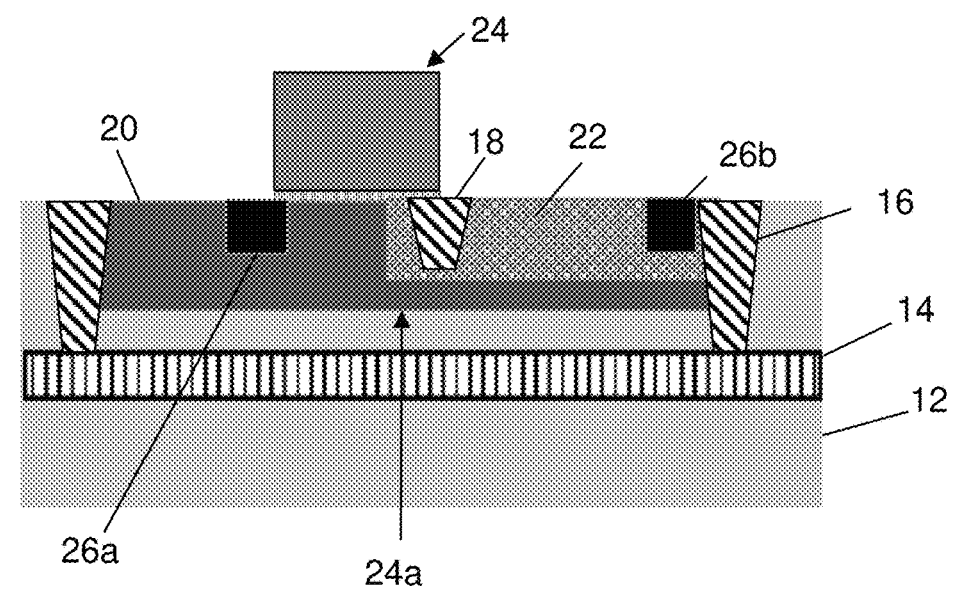
FIG. 3 shows a gate structure with an active region above the embedded isolation layer and within wells of the substrate, amongst other features, and respective fabrication processes in accordance with aspects of the present disclosure.

As shown in FIG. 3, well implants 20, 22 are formed above the isolation layer 14 within the substrate 12, followed by formation of a gate structure 24. In embodiments, the well implant 20 is a deep well implant, preferably using P-type dopants; whereas, the well implant 22 is a shallower well implant, preferably using N-type dopants. More specifically, the P-type dopants for the well implant 20 can be Boron and the N-type dopants for the well implant 22 can be Phosphorous or Arsenic or Antimony. In embodiments, the N-well 22 is formed on a drain side of the device; whereas, the P-well 20 extends to a source side of the device.

In more specific example, the wells 20, 22 are formed by introducing a dopant by, for example, ion implantation that introduces a concentration of a dopant in the substrate 12. The wells 20, 22 are formed by introducing a concentration of a different dopant of opposite conductivity type in the substrate 12. In embodiments, respective patterned implantation masks may be used to define selected areas exposed for the implantations. The implantation mask used to select the exposed area for forming well 20 is stripped after implantation of the well 20, and before the implantation mask used to form well 22. Similarly, the implantation mask used to select the exposed area for forming well 22 is stripped after the implantation is performed. The implantation masks may include a layer of a light-sensitive material, such as an organic photoresist, applied by a spin coating process, pre-baked, exposed to light projected through a photomask, baked after exposure, and developed with a chemical developer. Each of the implantation masks has a thickness and stopping power sufficient to block masked areas against receiving a dose of the implanted ions.

Still referring to FIG. 3, the gate structure 24 is formed over the wells 20, 22. As shown in FIG. 3, the active area 24a under the gate structure 24 is isolated by the deep trench isolation structure(s) 16 and the isolation layer 14. In this way, the isolation layer 14 used in the bulk substrate 12 will improve device performance. More specifically, for RF frequency applications, the isolation layer 14 will isolate the device from other devices and the substrate 12 as the drain oscillates between 0 to Vdd. Moreover, for power management applications (e.g., low MHz frequencies), the isolation layer 14 will help reduce the reverse recovery in a DC:DC convertor by adding a high resistive path. In addition, amongst other advantages, the isolation layer 14 prohibits the formation of parasitic bipolar issues which can trigger latch up.

The gate structure 24 can be representative of a LDMOS or EDMOS, as examples. In embodiments, the gate structure 24 can be composed of a gate dielectric material and gate electrode. The gate electrode can be a poly material and the gate dielectric material can be either a low-k or high-k gate dielectric material. For example, the high-k gate dielectric material can be $HfO_2$ $Al_2O_3$, $Ta_2O_3$, $TiO_2$, $La_2O_3$, $SrTiO_3$, $LaAlO_3$, $ZrO_2$, $Y_2O_3$, $Gd_2O_3$. The gate structure 24 is formed by conventional deposition, patterning and etching processes as is known in the art such that no further explanation is required herein for a complete understanding of the present disclosure.

Source and drain implants 26a, 26b, e.g., N+ implants, are provided in the wells 20, 22, respectively. In embodiments, the drain implant 26b is an extended drain implant, remotely positioned from the gate structure 24 within the N-well 22. More specifically, the drain implant 26b is between the shallow trench isolation structure 18 and the deep trench isolation structure 16, formed in the N-well 22. In this way, as should be understood by those of skill in the art, the combination of the N-well 22, shallow trench isolation structure 16 and drain implant 26 will form an extended drain structure within a drift region. Also, in this design scheme, the shallow trench isolation structure 18 will provide device to device isolation and can be used to extend the drift region of the device.

Figure 4:
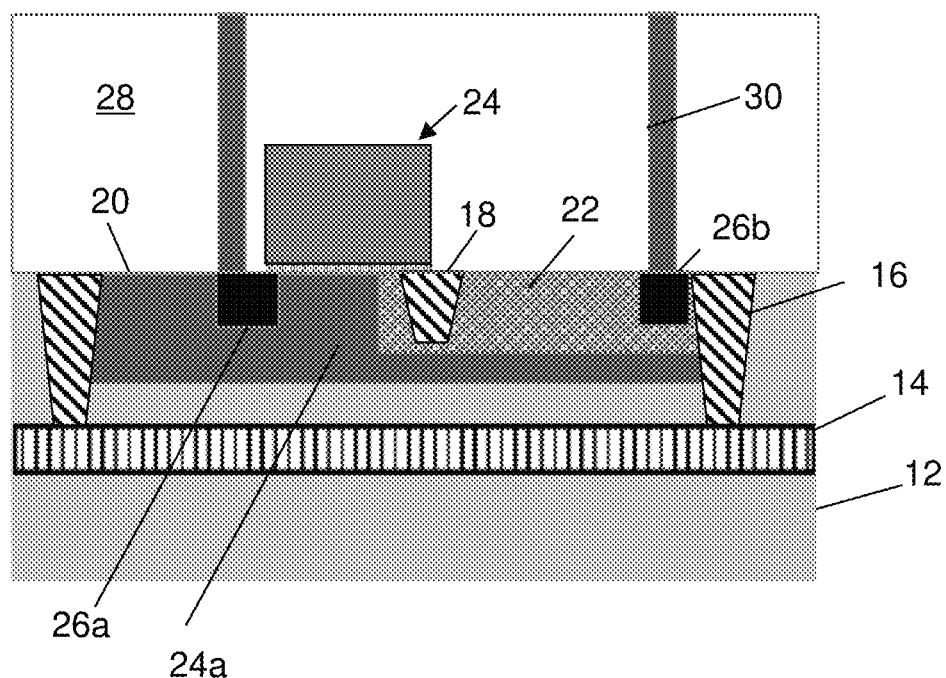
FIG. 4 shows contact formation to the gate structure and respective fabrication processes in accordance with aspects of the present disclosure.

FIG. 4 shows contact formation to the source and drain regions 26a, 26b. Prior to forming contacts 30, a silicide contacts are provided by deposition of a thin transition metal layer, e.g., nickel, cobalt or titanium, over fully formed and patterned semiconductor devices (e.g., doped or ion implanted source and drain regions 26a, 26b and respective devices 24). After deposition of the material, the structure is heated allowing the transition metal to react with exposed silicon (or other semiconductor material as described herein) in the active regions of the semiconductor device (e.g., source, drain, gate contact region) forming a low-resistance transition metal silicide. Following the reaction, any remaining transition metal is removed by chemical etching, leaving silicide contacts in the active regions of the device. It should be understood by those of skill in the art that silicide contacts will not be required on the devices, when a gate structure is composed of a metal material.

Following the silicide process, an interlevel dielectric material 28 is deposited over the structure, followed by lithography, etching and deposition processes (e.g., metallization process) to form the contacts 30. For example, the dielectric material 28 is deposited by a CVD process, followed by the lithography and etching (e.g., RIE) processes to form trenches within the dielectric material 28. A metal material, e.g., aluminum or tungsten, is deposited within the trenches to form the contacts 30. Any residual metal material can be removed from the surface of the dielectric material 40 by a conventional chemical mechanical planarization process.

The transistors can be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also commonly used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   a first well in a semiconductor substrate, the first well extending between a deep trench isolation structure on both sides of a gate structure;
   a second well in the semiconductor substrate, the second well comprising a dopant different than the first well and extending on one side of the gate structure within the first well;
   a shallow trench isolation structure within the second well;
   a drift region within the second well;
   a source implant in the first well; and
   a drain implant in a drift region within the second well and being remotely positioned from the shallow trench isolation structure.

2. The structure of claim 1, wherein the semiconductor substrate comprises a bulk substrate and the first well is in the bulk substrate and above an embedded isolation layer.

3. The structure of claim 2, wherein the second well is in the bulk substrate and above the embedded isolation.

4. The structure of claim 2, wherein the deep trench isolation structure extends through the bulk substrate and contacts the embedded isolation layer.

5. The structure of claim 4, wherein the first well extends between the deep trench isolation structure on sides of the gate structure.

6. The structure of claim 4, wherein the second well extends on one side of the gate structure.

7. The structure of claim 2, wherein the gate structure is over a top surface of the bulk substrate and vertically spaced away from the embedded isolation layer, the deep trench isolation structure and the embedded isolation layer defining an active area of the gate structure in the bulk substrate.

8. The structure of claim 2, wherein the embedded isolation layer comprises amorphous polysilicon sandwiched between semiconductor material of the bulk substrate.

9. The structure of claim 2, wherein the embedded isolation layer comprises amorphous semiconductor material sandwiched between single crystalline semiconductor material of the bulk substrate.

10. The structure of claim 2, wherein the embedded isolation layer comprises damaged semiconductor material sandwiched between Si semiconductor material of the bulk substrate.

11. The structure of claim 2, wherein the embedded isolation layer comprises high resistivity polysilicon and the bulk substrate comprises high resistivity Si.

12. The structure of claim 2, wherein the embedded isolation layer is structured to provide a high resistive path.

13. The structure of claim 2, wherein the deep trench isolation structure and the embedded isolation layer are structured to provide isolation between the gate structure and other devices as a drain of the gate structure oscillates between 0 to Vdd.

14. The structure of claim 2, wherein the embedded isolation layer has a first thickness under the deep trench isolation structure and a second thickness under the active area of the gate structure.

15. A structure comprising:
   an isolation layer comprising amorphous material buried within a semiconductor substrate;
   a gate structure vertically spaced away from the buried isolation layer;
      a first dual depth isolation structure contacting the amorphous material; and
      a second dual depth isolation structure separated from the amorphous material and adjacent to the gate;
   a first well in the semiconductor substrate on both sides of the gate structure;
   a second well in the semiconductor substrate and within the first well; and
   a drift region extending from the second dual depth isolation structure to the first dual depth isolation structure on one side of the gate structure; and
   a drain implant in the drift region and entirely within the second well.

16. The structure of claim 15, wherein the amorphous material comprises amorphous polysilicon sandwiched between single crystalline semiconductor material of the bulk substrate.

17. The structure of claim 15, wherein the first dual depth isolation structure is a deep trench isolation structure, the second dual depth isolation structure comprises a shallow trench isolation structure, adjacent to the gate structure, the shallow trench isolation structure is separated from the amorphous material by single crystalline semiconductor on insulator material, the drift region is between the shallow trench isolation structure and the drain implant, which is remotely positioned from the gate structure and the shallow trench isolation structure, and the drain implant contacts the deep trench isolation structure and is entirely within the second well in the drift region.

18. The structure of claim 16, wherein the amorphous polysilicon has a first thickness under the first dual depth isolation structure and a second thickness under the active area of the gate structure.

19. A method comprising:
   forming a deep well of a first conductivity type in a bulk semiconductor substrate on both sides and within a channel region of a gate structure, the deep well extending to a deep trench isolation structure and under a shallow trench isolation structure;
   forming a second well comprising a second conductivity type different than the first conductivity type, which extends on only one side of the gate structure and is within the deep well;
   forming a shallow trench isolation region within the second well;
   forming a first diffusion region in the first well and a second diffusion region in the second well, the second diffusion region being formed remotely from the shallow trench isolation structure within the second well.

20. The method of claim 19, further comprising damaging the bulk semiconductor substrate to form an embedded amorphous isolation layer within the bulk semiconductor substrate, wherein:
   the deep trench isolation structure extends through the bulk semiconductor substrate and contacts the embedded amorphous isolation layer; and
   the shallow trench isolation structure extends through the bulk semiconductor substrate and is separated from the embedded amorphous isolation layer with single crystalline material of the bulk semiconductor substrate.

* * * * *